(12) United States Patent
Hsu et al.

(10) Patent No.: US 10,032,652 B2
(45) Date of Patent: Jul. 24, 2018

(54) SEMICONDUCTOR PACKAGE HAVING IMPROVED PACKAGE-ON-PACKAGE INTERCONNECTION

(71) Applicant: Advanced Semiconductor Engineering, Inc., Kaohsiung (TW)

(72) Inventors: Wen Tsung Hsu, Kaohsiung (TW); Cheng-Hsien Yu, Kaohsiung (TW); Chun Yuan Tsai, Kaohsiung (TW); Tzung Shiou Tsai, Kaohsiung (TW); Jia Hao Ye, Kaohsiung (TW); Kuang Yi Hou, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 72 days.

(21) Appl. No.: 14/562,214

(22) Filed: Dec. 5, 2014

(65) Prior Publication Data
US 2016/0163612 A1 Jun. 9, 2016

(51) Int. Cl.
*H01L 23/02* (2006.01)
*H01L 21/56* (2006.01)
(Continued)

(52) U.S. Cl.
CPC .......... *H01L 21/565* (2013.01); *H01L 21/563* (2013.01); *H01L 23/3128* (2013.01); *H01L 24/97* (2013.01); *H01L 25/105* (2013.01); *H01L 24/16* (2013.01); *H01L 24/48* (2013.01); *H01L 2224/16225* (2013.01); *H01L 2224/16227* (2013.01); *H01L 2224/48091* (2013.01);
(Continued)

(58) Field of Classification Search
CPC . H01L 23/315; H01L 23/3128; H01L 21/565; H01L 23/528; H01L 21/56; H01L 25/105; H01L 24/97; H01L 21/563; H01L 2924/00014; H01L 2924/181; H01L 2924/15311; H01L 2224/16225; H01L 2224/48227; H01L 2225/1023; H01L 2225/1058; H01L 2224/16227; H01L 24/16
USPC ........................................................ 257/686
See application file for complete search history.

(56) References Cited

U.S. PATENT DOCUMENTS 5,943,597 A * 8/1999 Kleffner .................. H01L 24/05
257/737
7,898,093 B1 * 3/2011 Darveaux ............... H01L 21/56
257/678
(Continued)

FOREIGN PATENT DOCUMENTS

JP           2004047637 A   *  2/2004

*Primary Examiner* — Anthony Ho
*Assistant Examiner* — Mohammad M Hoque
(74) *Attorney, Agent, or Firm* — Foley & Lardner LLP; Cliff Z. Liu

(57) ABSTRACT

The present disclosure relates to semiconductor packages and methods of manufacturing the same. In an embodiment, the semiconductor package includes a substrate, a semiconductor element, at least one connecting element, and an encapsulant. The semiconductor element is mounted to the substrate. The connecting element is disposed on the substrate and adjacent to the semiconductor element. The encapsulant covers at least a portion of the semiconductor element and at least a portion of the connecting element and defines at least one first groove surrounding the connecting element.

19 Claims, 9 Drawing Sheets

(51) Int. Cl.
  *H01L 23/31* (2006.01)
  *H01L 25/10* (2006.01)
  *H01L 23/00* (2006.01)

(52) U.S. Cl.
  CPC  *H01L 2224/48227* (2013.01); *H01L 2224/97* (2013.01); *H01L 2225/1023* (2013.01); *H01L 2225/1058* (2013.01); *H01L 2924/00014* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01)

(56) References Cited

U.S. PATENT DOCUMENTS

| | | | |
|---|---|---|---|
| 8,471,394 B2 | 6/2013 | Jang et al. | |
| 8,546,932 B1* | 10/2013 | Chung | H01L 23/49816 |
| | | | 257/686 |
| 8,618,659 B2 | 12/2013 | Sato et al. | |
| 2002/0168797 A1* | 11/2002 | DiStefano | H01L 21/56 |
| | | | 438/106 |
| 2005/0070083 A1* | 3/2005 | Johnson | H01L 24/13 |
| | | | 438/612 |
| 2006/0244139 A1* | 11/2006 | Daubenspeck | H01L 23/3171 |
| | | | 257/737 |
| 2007/0037319 A1* | 2/2007 | Chan | H01L 21/6835 |
| | | | 438/108 |
| 2010/0120199 A1 | 5/2010 | Lim et al. | |
| 2010/0171205 A1* | 7/2010 | Chen | H01L 21/565 |
| | | | 257/686 |
| 2011/0062574 A1* | 3/2011 | Jang | H01L 21/565 |
| | | | 257/686 |
| 2011/0101512 A1* | 5/2011 | Choi | H01L 24/29 |
| | | | 257/686 |
| 2011/0156264 A1* | 6/2011 | Machida | H01L 21/4846 |
| | | | 257/773 |
| 2011/0233747 A1* | 9/2011 | Lee | H01L 23/31 |
| | | | 257/686 |
| 2012/0086003 A1* | 4/2012 | Park | H01L 21/56 |
| | | | 257/48 |
| 2013/0292833 A1* | 11/2013 | Won | H01L 23/49816 |
| | | | 257/738 |
| 2014/0077369 A1* | 3/2014 | Liang | H01L 23/49816 |
| | | | 257/738 |
| 2014/0196940 A1* | 7/2014 | Healy | H05K 1/0271 |
| | | | 174/263 |
| 2015/0243616 A1* | 8/2015 | Hu | H01L 24/13 |
| | | | 257/738 |

* cited by examiner

SEMICONDUCTOR PACKAGE HAVING IMPROVED PACKAGE-ON-PACKAGE INTERCONNECTION

BACKGROUND

1. Technical Field

The present disclosure relates to semiconductor packages and methods of manufacturing the same, and, more particularly, to a stacked semiconductor package-on-package (PoP) configuration and method of manufacturing the same.

2. Description of the Related Art

With an increased demand for smaller and lighter electronic products with more functionalities and higher performance, semiconductor package structures continue to become thinner and ever more miniaturized. These increasing demands for miniaturization, more functionalities and higher performance result in more compact designs and a significant increase in integrated circuit (IC) density and performance. Although new techniques, such as surface mount technology (SMT), are developed to increase semiconductor chip density on a single substrate, IC density continues to be limited by the space available for mounting chips on a substrate.

One way to further increase IC density is to stack semiconductor chips vertically. Multiple stacked chips can be combined into a single package in this manner with a small surface area on a printed circuit board or other substrate. This solution of stacking IC components vertically also has been extended to the stacking of entire packages upon each other. Such PoP configuration continues to become increasingly popular as the semiconductor industry continues to demand semiconductor devices with lower costs, higher performance, increased miniaturization, and greater packaging densities.

A key challenge in a PoP configuration is how to align and stack a package on another package precisely while maintaining workable electrical connections therebetween. Solder joints used to electrically connect one package to another may shift, become fractured, or overflow during a molding process in the stacking and which leads to problems such as disconnection or short circuit.

Thus, a need still remains for a semiconductor package including a PoP configuration when incorporating existing and increasingly complex IC and package configurations, and continuing substantial improvements in PoP solutions are thus needed.

SUMMARY

An aspect of the present disclosure relates to a semiconductor package. In an embodiment, the semiconductor package comprises a substrate, a semiconductor element, at least one connecting element and an encapsulant. The semiconductor element is mounted to the substrate. The connecting element is disposed on the substrate and adjacent to the semiconductor element. The encapsulant covers at least a portion of the semiconductor element and at least a portion of the connecting element. The encapsulant has a top surface, the encapsulant defines at least one first groove surrounding the connecting element and downwardly recessed from the top surface of the encapsulant, and the connecting element is exposed from and extends upwardly from the top surface of the encapsulant.

Another aspect of the present disclosure relates to a semiconductor package. In an embodiment, the semiconductor package comprises a bottom substrate, a top substrate, a bottom semiconductor element, at least one interconnecting element and a bottom encapsulant. The bottom semiconductor element is mounted to the bottom substrate. The interconnecting element connects the bottom substrate and the top substrate. The bottom encapsulant covers at least a portion of the bottom semiconductor element and at least a portion of the interconnecting element. The bottom encapsulant comprises a peak portion surrounding the interconnecting element.

Another aspect of the present disclosure relates to a method of manufacturing a semiconductor package. In an embodiment, the method comprises: providing a semiconductor structure, wherein the semiconductor structure comprises a substrate, a semiconductor element and at least one connecting element, the semiconductor element is mounted to the substrate, the connecting element is disposed on the substrate and adjacent to the semiconductor element; providing a deformable layer; pressing the deformable layer against the connecting element so that the deformable layer comprises at least one first protruding portion surrounding the connecting element; and forming an encapsulant in a space between the deformable layer and the substrate, wherein the encapsulant covers at least a portion of the semiconductor element and at least a portion of the connecting element, wherein the encapsulant defines at least one first groove corresponding to the first protruding portion.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain element or certain plane of an element, as described in the specification and shown in the figures. Furthermore, it should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
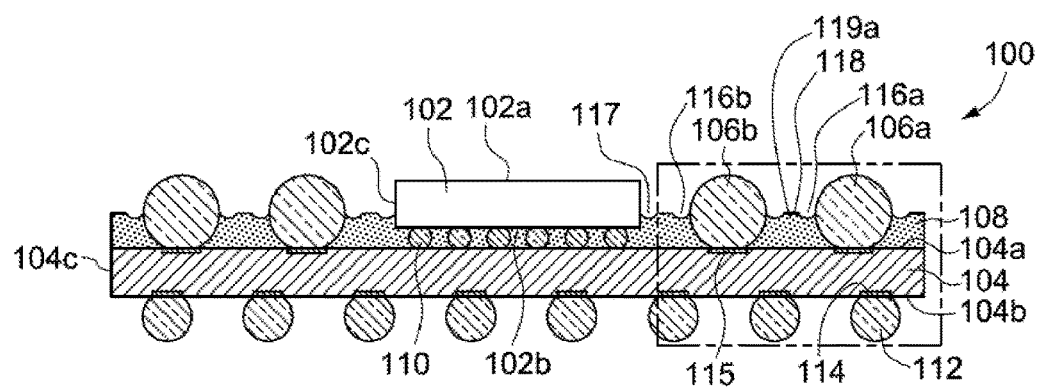
FIG. 1 illustrates a cross-sectional view of a semiconductor package that may constitute a bottom package of a PoP configuration according to an embodiment of the present disclosure.

FIG. 1 illustrates a cross-sectional view of a semiconductor package 100 that may constitute a bottom package of a PoP assembly or configuration according to an embodiment of the present disclosure. The semiconductor package 100 comprises a semiconductor element 102, a substrate 104, at least one connecting element (for example, a plurality of connecting elements 106a, 106b), an encapsulant 108, and a plurality of solder balls 112. If desired, it is to be understood that embodiments of the present disclosure may be applied to a top package or an intermediate package of an assembly with suitable modifications.

The semiconductor element 102 is mounted and electrically connected to the substrate 104. The semiconductor element 102 has a top surface 102a, a bottom surface 102b, and a side surface 102c. In an embodiment, the semiconductor element 102 may be electrically connected to a top surface 104a of the substrate 104 through a plurality of interconnectors 110, such as copper pillars or solder/stud bumps, positioned on respective pads of the bottom surface 102b of the semiconductor element 102 and on respective pads of the top surface 104a of the substrate 104. Alternatively, the semiconductor element 102 may be electrically connected to the top surface 104a of the substrate 104 through respective wire bonds or similar connections. In this embodiment, the semiconductor element 102 may be a die or a semiconductor chip. In an embodiment, the die may implement various types of memory devices or logic processor devices.

In this embodiment, the substrate 104 is a package substrate, which can be made of, for example, a metal, a ceramic, a glass-reinforced epoxy (e.g., FR4), polyimide, silicon, or Bismaleimide/Triazine (BT) resin. The substrate 104 has the top surface 104a, a bottom surface 104b, a side surface 104c, a plurality of top pads 115 and a plurality of bottom pads 114. The side surface 104c is disposed between the top surface 104a and the bottom surface 104b. The top pads 115 are disposed adjacent to the top surface 104a, and the bottom pads 114 are disposed adjacent to the bottom surface 104b. The substrate 104 may include a plurality of vias (not shown) extending from the top surface 104a of the substrate 104 to the bottom surface 104b of the substrate 104 and connecting the semiconductor element 102 to the bottom pads 114 so that the semiconductor element 102 may be electrically connected to an external environment through the solder balls 112.

The solder balls 112 are attached to the bottom surface 104b of the substrate 104 through the respective bottom pads 114 of the substrate 104. The solder balls 112 serve as external connection terminals. An underfill material may be provided in a region between the semiconductor element 102 and the substrate 104 to protect the interconnectors 110 from the environment.

The connecting elements 106a, 106b are attached to the top surface 104a of the substrate 104 through the respective top pads 115 of the substrate 104. In this embodiment, the connecting elements 106a, 106b are conductive balls or bumps, such as solder balls.

The encapsulant 108 partially encapsulates the semiconductor element 102 and partially encapsulates the connecting elements 106a, 106b, and exposes an upper portion of the semiconductor element 102 and an upper portion of the connecting elements 106a, 106b. In this embodiment, a material of the encapsulant 108 can include, for example, an epoxy resin or a molding compound. In this embodiment, the encapsulant 108 covers at least a lower portion of the semiconductor element 102 and at least a lower portion of each of the connecting elements 106a and 106b, and defines at least one first groove (for example, a plurality of first grooves 116a, 116b) surrounding the connecting elements 106a, 106b, respectively. That is, each of the first grooves 116a, 116b surrounds a respective one of the connecting elements 106a, 106b. As such, when a material of the connecting elements 106a, 106b is molten and overflows because of a reflow process or for other reasons, these first grooves 116a, 116b can provide a buffer and accommodate a portion of the overflowing material of the connecting elements 106a, 106b. Therefore, the adjacent connecting elements 106a, 106b will not contact each other and cause a short circuit.

In this embodiment, the encapsulant 108 further defines at least one second groove 117 surrounding the semiconductor element 102. The second groove 117 and the first grooves 116a, 116b are formed in a common manufacturing operation of some embodiments of this disclosure.

Figure 2:
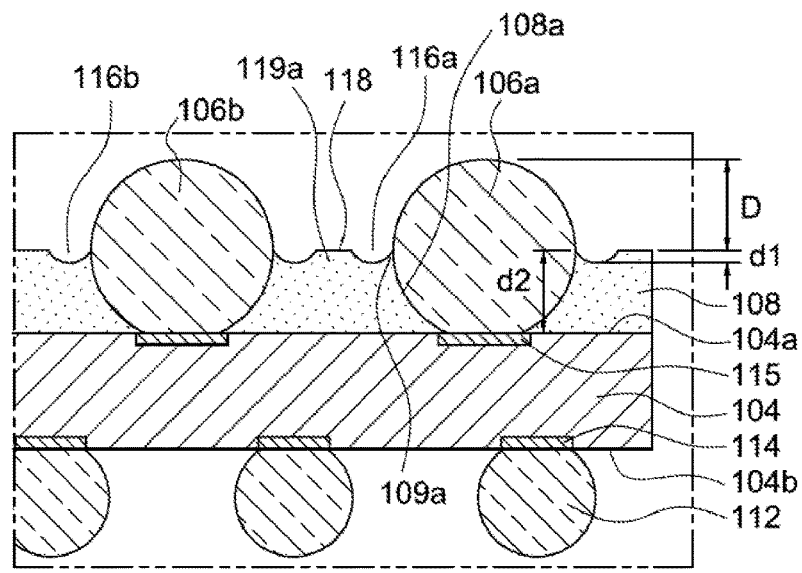
FIG. 2 illustrates an enlarged view of a region of the semiconductor package illustrated in FIG. 1.

FIG. 2 illustrates an enlarged view of a region of the semiconductor package 100 illustrated in FIG. 1. As shown in FIG. 2, in this embodiment, a cross section of each of the first grooves 116, 116b exhibits a shape that is concave or substantially concave. In this embodiment, the encapsulant 108 has a top surface 118, and each of the first grooves 116, 116b is downwardly recessed from the top surface 118. In this embodiment, the top surface 118 between the first groove 116a and the first groove 116b is flat or substantially flat, namely where any displacement from planarity is small, such as no greater than 1 µm, no greater than 0.5 µm, or no greater than 0.1 µm. In this embodiment, the top surface 118 of the encapsulant 108 and the top end of each of the connecting elements 106a, 106b are spaced by a distance D. That is, the distance D is between the top surface 118 of the encapsulant 108 and the top end of each of the connecting elements 106a, 106b, and, thus, the connecting elements 106a, 106b are exposed from and extend upwardly from the top surface 118 of the encapsulant 108 by the distance D. In this embodiment, two adjacent first grooves 116a, 116b define a protrusion 119a so as to prevent the material of the connecting element 106a or 106b from overflowing to the adjacent connecting element 106a or 106b.

In this embodiment, the encapsulant 108 further defines at least one accommodating cavity 108a for accommodating a portion of the connecting element 106a. A peak portion 109a of the encapsulant 108 is defined by the first groove 116a and the accommodating cavity 108a. That is, a sidewall of the first groove 116a and a sidewall of the accommodating cavity 108a intersect to form the peak portion 109a, and the peak portion 109a surrounds the connecting element 106a. The peak portion 109a is in contact with a sidewall of the connecting element 106a, and can hold the connecting element 106a, especially when the connecting element 106a is softened. In this embodiment, a depth $d_1$ of the first groove 116a is a distance between the top surface 118 of the encapsulant 108 and a bottom or lowermost portion of the first groove 116a, and the depth $d_1$ of the first groove 116a is less than a depth $d_2$ of the accommodating cavity 108a, which is a distance between the peak portion 109a and the top surface 104a of the substrate 104. In one embodiment, the depth $d_1$ of the first groove 116a is no greater than or less than ½ of the depth $d_2$ of the accommodating cavity 108a, such as where $d_1 \leq 0.45 \times d_2$, $d_1 \leq 0.4 \times d_2$, $d_1 \leq 0.35 \times d_2$, $d_1 \leq 0.3 \times d_2$, $d_1 \leq 0.25 \times d_2$, or $d_1 \leq 0.2 \times d_2$. However, in another embodiment, the depth $d_1$ of the first groove 116a may be greater than ½ of the depth $d_2$ of the accommodating cavity 108a. As shown in FIG. 2, the bottom or lowermost portion of the concave-shaped first groove 116a is spaced apart from the connecting element 106a.

On the other hand, in this embodiment, the depth $d_2$ may be smaller than the distance D so that a larger portion of the connecting element 106a is exposed from the encapsulant 108 for bonding. As such, when a top package is bonded to the semiconductor package 100 through the connecting elements 106a, 106b, the bonding quality can be improved. Also, in this embodiment, the depth $d_1$ of the first groove 116a is less than the distance D, such as no greater than or less than ½ of the distance D, or where $d_1 \leq 0.45 \times D$, $d_1 \leq 0.4 \times D$, $d_1 \leq 0.35 \times D$, $d_1 \leq 0.3 \times D$, $d_1 \leq 0.25 \times D$, or $d_1 \leq 0.2 \times D$.

Figure 2A:
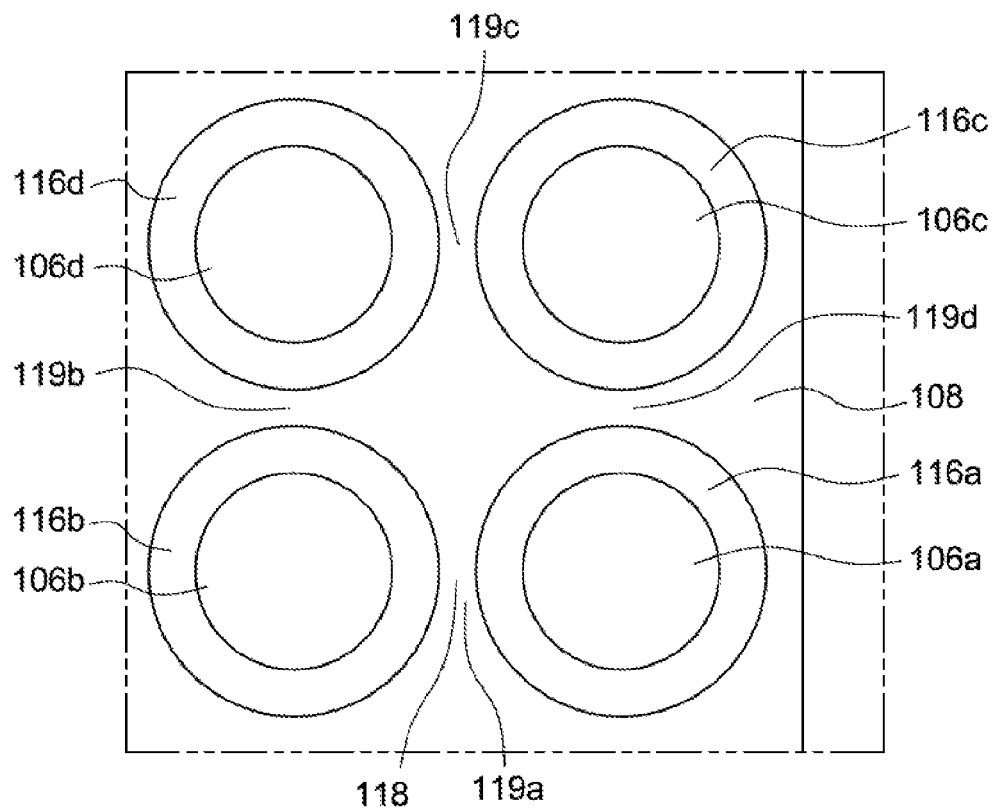
FIG. 2A illustrates a top view of the region illustrated in FIG. 2.

FIG. 2A illustrates a top view of the region illustrated in FIG. 2. As shown in FIG. 2A, each of four first grooves 116a, 116b, 116c, 116d is in a ring shape, and four connecting elements 106a, 106b, 106c, 106d are arranged in an array, wherein the first groove 116a surrounds the connecting element 106a, the first groove 116b surrounds the connecting element 106b, the first groove 116c surrounds the connecting element 106c, and the first groove 116d surrounds the connecting element 106d. The protrusion 119a is defined by two adjacent first grooves 116a, 116b, a protrusion 119b is defined by two adjacent first grooves 116b, 116d, a protrusion 119c is defined by two adjacent first grooves 116c, 116d, and a protrusion 119d is defined by two adjacent first grooves 116c, 116a. Top surfaces of the protrusions 119a, 119b, 119c, 119d can be flat or substantially flat, and are a part of the top surface 118 of the encapsulant 108.

Figure 3:
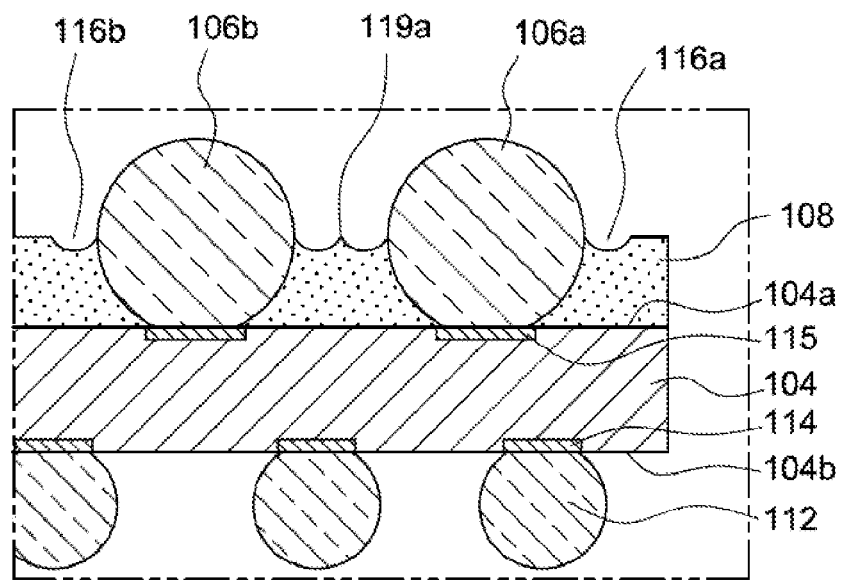
FIG. 3 illustrates an enlarged view of a region of a semiconductor package according to another embodiment of the present disclosure.

FIG. 3 illustrates an enlarged view of a region of the semiconductor package 100 illustrated in FIG. 1 according to another embodiment of the present disclosure. This embodiment is similar to that illustrated in FIG. 2 except that the connecting element 106a and the connecting element 106b are arranged closer to each other so that the first groove 116a surrounding the connecting element 106a and the first groove 116b surrounding the connecting element 106b at least partially touch or overlap each other. As a result, the protrusion 119a defined by the adjacent first grooves 116a and 116b may exhibit a peak or substantially peak shape.

Figure 3A:
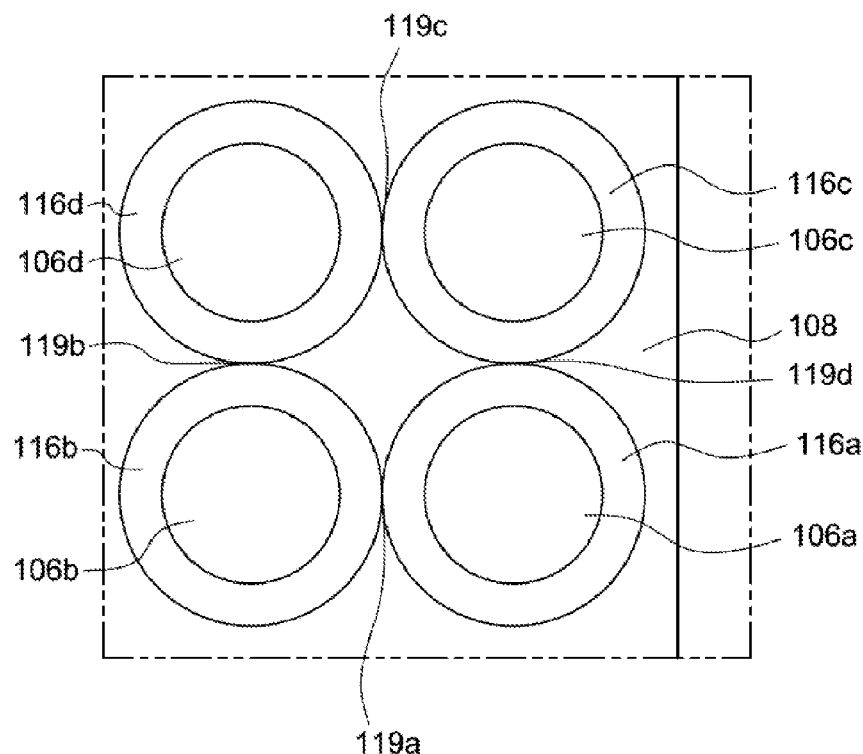
FIG. 3A illustrates a top view of the region illustrated in FIG. 3.

FIG. 3A illustrates a top view of the region illustrated in FIG. 3. Similar to that shown in FIG. 2A, each of the four first grooves 116a, 116b, 116c, 116d is in a ring shape, and the four connecting elements 106a, 106b, 106c, 106d are arranged in an array, wherein the first groove 116a surrounds the connecting element 106a, the first groove 116b surrounds the connecting element 106b, the first groove 116c surrounds the connecting element 106c, and the first groove 116d surrounds the connecting element 106d in FIG. 3A. Nevertheless, in this figure, two adjacent first grooves 116a and 116b may at least partially touch each other and define a peak-shaped protrusion 119a; two adjacent first grooves 116b and 116d may at least partially touch each other and define a peak-shaped protrusion 119b; two adjacent first grooves 116d and 116c may at least partially touch each other and define a peak-shaped protrusion 119c; and two adjacent first grooves 116c and 116a may at least partially touch each other and define a peak-shaped protrusion 119d.

Figure 4:
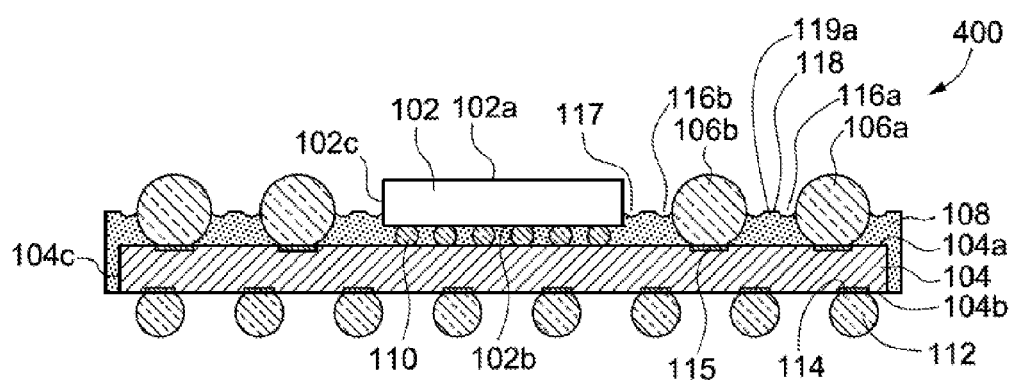
FIG. 4 illustrates a cross-sectional view of a semiconductor package that may constitute a bottom package of a PoP configuration according to another embodiment of the present disclosure.

FIG. 4 illustrates a cross-sectional view of a semiconductor package 400 that may constitute a bottom package of a PoP assembly or configuration according to another embodiment of the present disclosure. The semiconductor package 400 is similar to the semiconductor package 100 illustrated in FIG. 1 except that the encapsulant 108 covers the side surface 104c of the substrate 104. In this embodiment, the substrate 104 is a reconstitution substrate. In comparison, in the semiconductor package 100 illustrated in FIG. 1, a side surface of the encapsulant 108 is coplanar or substantially coplanar with the side surface 104c of the substrate 104, namely where any displacement between the two surfaces is small, such as no greater than 1 μm, no greater than 5 μm, or no greater than 10 μm.

Figure 5:
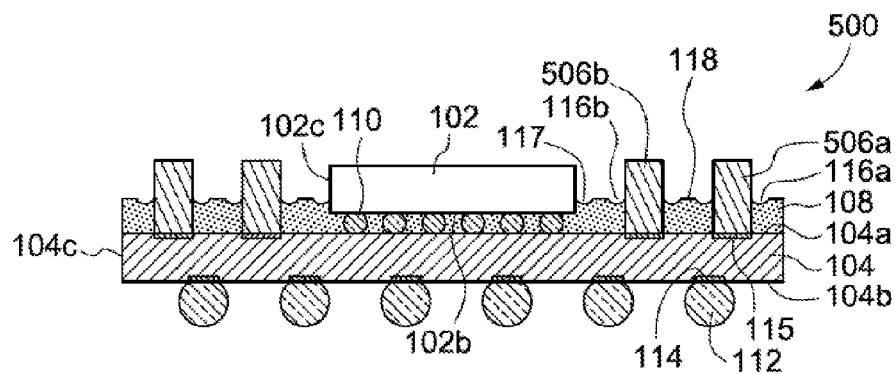
FIG. 5 illustrates a cross-sectional view of a semiconductor package that may constitute a bottom package of a PoP configuration according to another embodiment of the present disclosure.

FIG. 5 illustrates a cross-sectional view of a semiconductor package 500 that may constitute a bottom package of a PoP assembly or configuration according to another embodiment of the present disclosure. The semiconductor package 500 is similar to the semiconductor package 100 illustrated in FIG. 1 except that connecting elements 506a, 506b are metal pillars, such as copper pillars.

Figure 6:
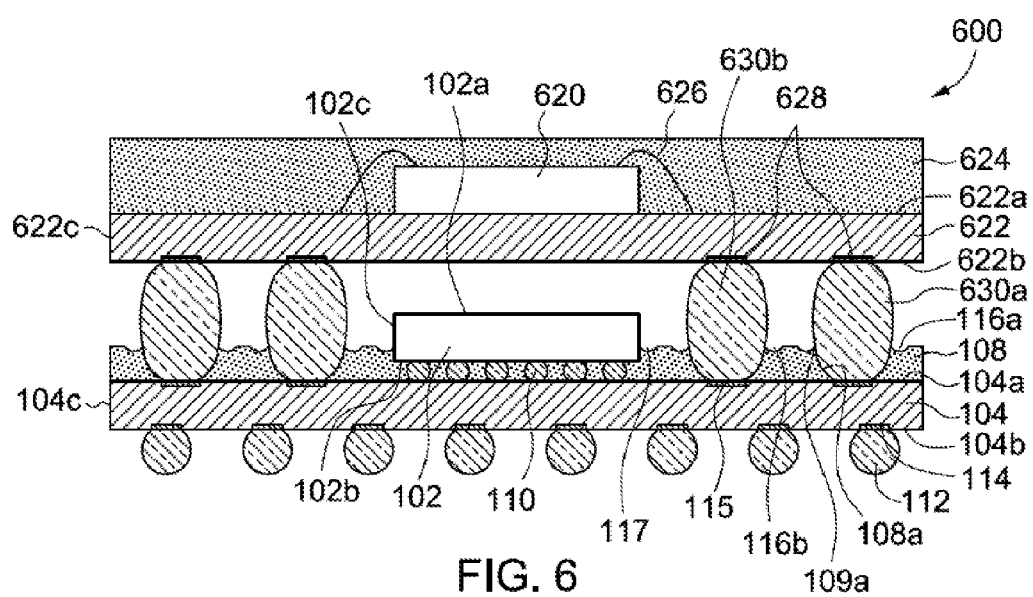
FIG. 6 illustrates a cross-sectional view of a PoP configuration according to an embodiment of the present disclosure.

FIG. 6 illustrates a cross-sectional view of a PoP assembly or configuration 600 according to an embodiment of the present disclosure. The PoP assembly 600 comprises a bottom semiconductor element 102, a bottom substrate 104, a bottom encapsulant 108, a top semiconductor element 620, a top substrate 622, a top encapsulant 624, at least one interconnecting element (for example, a plurality of interconnecting elements 630a and 630b), and a plurality of solder balls 112. The bottom semiconductor element 102, the bottom substrate 104, the bottom encapsulant 108 and the solder balls 112 of this embodiment are the same as the semiconductor element 102, the substrate 104, the bottom encapsulant 108 and the solder balls 112 of the semiconductor package 100 illustrated in FIG. 1, respectively.

In this embodiment, the top substrate 622 is a package substrate, which can be made of, for example, a metal, a ceramic, a glass-reinforced epoxy (e.g., FR4), polyimide, silicon, or Bismaleimide/Triazine (BT) resin. The top substrate 622 has a top surface 622a, a bottom surface 622b, a side surface 622c, a plurality of top pads (not shown) and a plurality of bottom pads 628. The side surface 622c is disposed between the top surface 622a and the bottom surface 622b.

The top semiconductor element 620 is mounted and electrically connected to the top substrate 622, and the top encapsulant 624 covers at least a portion of the top semiconductor element 620. In this embodiment, the top semiconductor element 622 may be electrically connected to the top surface 622a of the top substrate 622 through respective bonding wires 626. Alternatively, the top semiconductor element 620 may be electrically connected to the top surface 622a of the top substrate 622 through a plurality of interconnectors, such as solder/stud bumps or copper pillars.

In this embodiment, the interconnecting elements 630a, 630b are positioned on respective top pads 115 of the bottom substrate 104 and respective bottom pads 628 of the top substrate 622 so as to connect the top substrate 622 and the bottom substrate 104. In an embodiment, the interconnecting elements 630a, 630b may be solder/stud bumps or solder balls formed by combining solder balls positioned on the top pads 115 of the bottom substrate 104 and solder balls positioned on the bottom pads 628 of the top substrate 622. The bottom encapsulant 108 partially encapsulates the bottom semiconductor element 102, partially encapsulates the interconnecting elements 630a, 630b and exposes an upper portion of the bottom semiconductor element 102 and an upper portion of the interconnecting elements 630a, 630b. In this embodiment, a material of the bottom encapsulant 108 can include, for example, an epoxy resin or a molding compound. In this embodiment, the bottom encapsulant 108 covers at least a lower portion of the bottom semiconductor element 102 and at least a lower portion of each of the interconnecting elements 630a, 630b, and defines at least one first groove (for example, a plurality of first grooves 116a, 116b) surrounding the interconnecting elements 630a, 630b, respectively. As such, when a material of the interconnecting elements 630a, 630b overflows because of a reflow process or other reasons, these grooves 116a, 116b can provide a buffer and accommodate a portion of the overflowing material of the interconnecting elements 630a, 630b. Therefore, the adjacent interconnecting elements 630a, 630b will not contact to each other and cause a short circuit. It is noted that the amount of the material of each of the interconnecting elements 630a, 630b can be controlled precisely; therefore, the interconnecting elements 630a, 630b do not overflow into the first grooves 116a, 116b.

In this embodiment, a side surface of the bottom encapsulant 108 is coplanar or substantially coplanar with a side surface 104c of the bottom substrate 104. However, in another embodiment, the bottom encapsulant 108 may further cover the side surface 104c of the bottom substrate 104. In this embodiment, the bottom encapsulant 108 further defines a second groove 117 surrounding the bottom semiconductor element 102. The second groove 117 and the first grooves 116a, 116b are formed in a common manufacturing operation of some embodiments of this disclosure. In this embodiment, the bottom encapsulant 108 further defines at least one accommodating cavity 108a for accommodating a portion of the interconnecting element 630a. A peak portion 109a is defined by the first groove 116a and the accommodating cavity 108a. That is, a sidewall of the first groove 116a and a sidewall of the accommodating cavity 108a intersect to form the peak portion 109a, and the peak portion 109a surrounds the interconnecting element 630a. As shown in FIG. 2, the depth $d_1$ of the first groove 116a is less than the depth $d_2$ of the accommodating cavity 108a.

Figure 7:
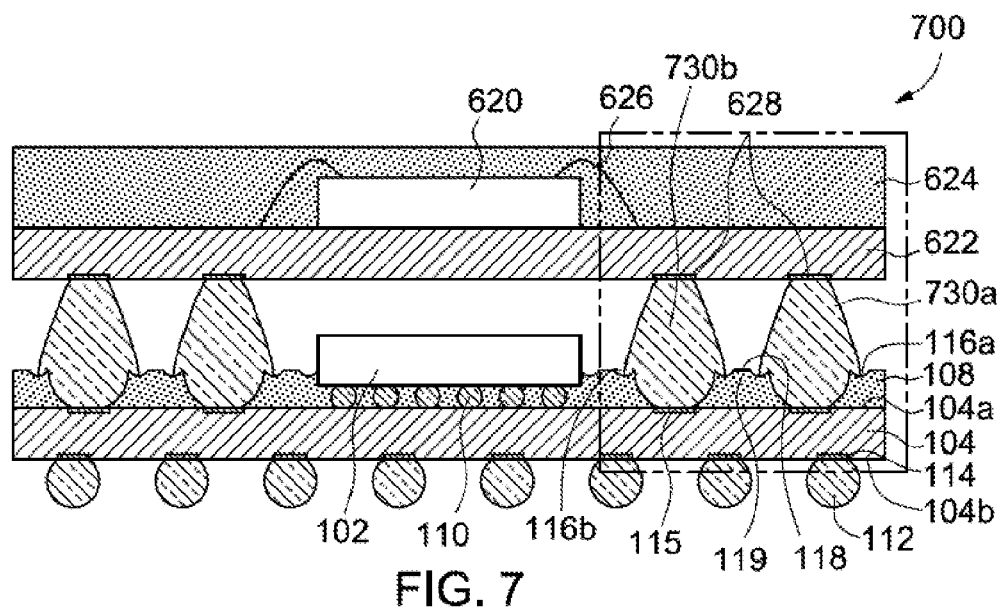
FIG. 7 illustrates a cross-sectional view of a PoP configuration according to another embodiment of the present disclosure.

FIG. 7 illustrates a cross-sectional view of a PoP assembly 700 according to another embodiment of the present disclosure. The PoP assembly 700 is similar to the PoP assembly 600 illustrated in FIG. 6 except that portions of interconnecting elements 730a, 730b are disposed in the first grooves 116a, 116b because of overflowing occurred during a solder reflow process. That is, an excess amount of a material of the interconnecting elements 730a, 730b is included, and the excess material of the interconnecting elements 730a, 730b will overflow into the first grooves 116a, 116b. However, the first grooves 116a, 116b provide a buffer to accommodate the overflowing material, such that the adjacent interconnecting elements 730a, 730b will not contact each other and cause a short circuit.

Figure 7A:
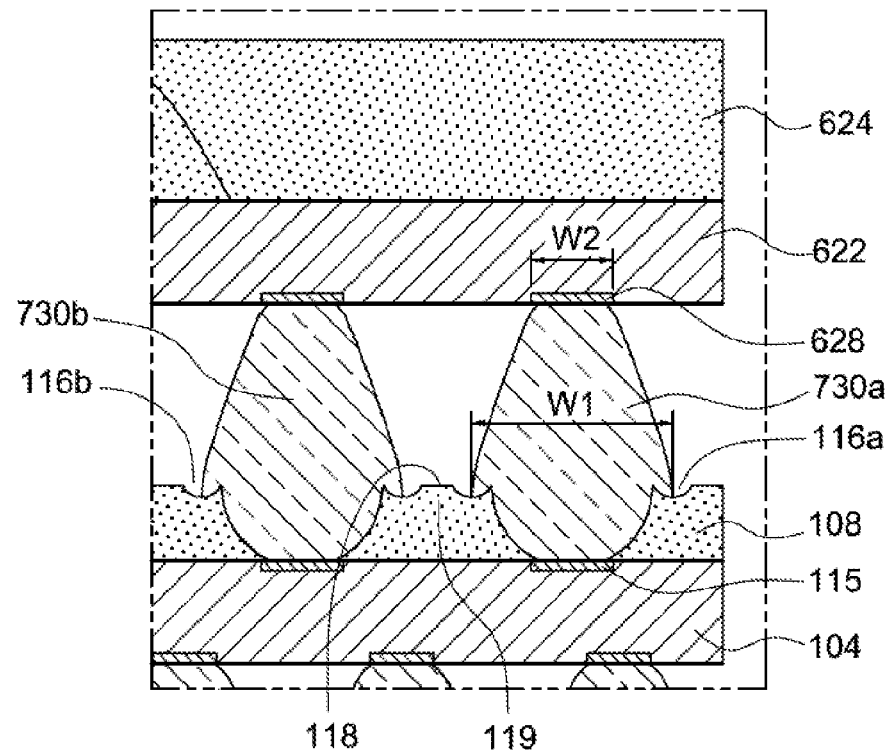
FIG. 7A illustrates an enlarged view of a region of the PoP configuration illustrated in FIG. 7.

FIG. 7A illustrates an enlarged view of a region of the PoP assembly 700 illustrated in FIG. 7. As shown in FIG. 7A, in this embodiment, a cross section of each of the first grooves 116, 116b exhibits a shape that is concave or substantially concave. In this embodiment, the bottom encapsulant 108 has a top surface 118. In this embodiment, the top surface 118 between the first groove 116a and the first groove 116b is flat or substantially flat, namely where any displacement from planarity is small, such as no greater than 1 μm, no greater than 0.5 μm, or no greater than 0.1 μm. In this embodiment, two adjacent first grooves 116a, 116b define a protrusion 119 so as to prevent the material of the interconnecting elements 730a, 730b from overflowing and contacting one another.

In this embodiment, the first grooves 116a, 116b may provide a buffer and accommodate portions of the interconnecting elements 730a, 730b. As such, a risk that adjacent interconnecting elements 730a, 730b may touch each other and cause a short circuit because of the overflow can be avoided. In this embodiment, a width W1 of the interconnecting element 730a measured from one side of the interconnecting element 730a in the first groove 116a to an opposite side of the interconnecting element 730a in the first groove 116a may be the greatest lateral extent of the interconnecting element 730a. Specifically, the width W1 of the interconnecting element 730a measured from one side of the interconnecting element 730a in the first groove 116a to the opposite side of the interconnecting element 730a in the first groove 116a is greater than or equal to a width W2 of an upper portion (e.g., an uppermost portion) of the interconnecting element 730a, such as where W1≥1.05×W2, W1≥1.1×W2, W1≥1.2×W2, W1≥1.3×W2, W1≥1.4×W2, or W1≥1.5×W2.

FIG. 8A, FIG. 8B, FIG. 8C, and FIG. 8D illustrate a method for manufacturing a semiconductor package according to an embodiment of the present disclosure. For example, this method can be used to manufacture the semiconductor package 100 described in connection with FIG. 1.

Figure 8A:
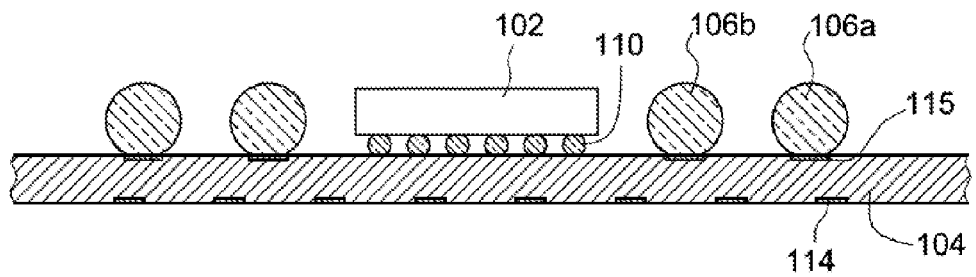
FIG. 8A, FIG. 8B, FIG. 8C, and FIG. 8D illustrate a method for manufacturing a semiconductor package according to an embodiment of the present disclosure.

Referring to FIG. 8A, a semiconductor structure, such as a semi-product, is provided. The structure comprises a substrate 104, a semiconductor element 102 and at least one connecting element (for example, a plurality of connecting elements 106a, 106b). The semiconductor element 102 is mounted to the substrate 104 through a plurality of interconnectors 110, such as a plurality of copper pillars or solder/stud bumps, positioned on respective bottom pads of the semiconductor element 102 and on respective top pads 115 of the substrate 104. The connecting elements 106a, 106b are disposed on the substrate 104 and adjacent to the semiconductor element 102.

Figure 8B:
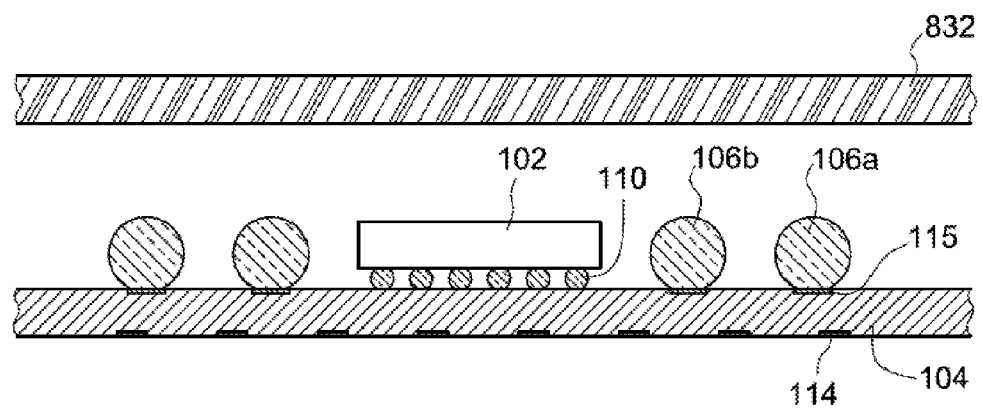

Referring to FIG. 8B, a deformable or soft layer 832 is provided. In this embodiment, the deformable layer 832 is made of a rubber or another suitable elastomer or elastomeric material, and a bottom surface of the deformable layer 832 is flat or substantially flat. However, in another embodiment, the bottom surface of the deformable layer 832 may have a pattern.

Figure 8C:
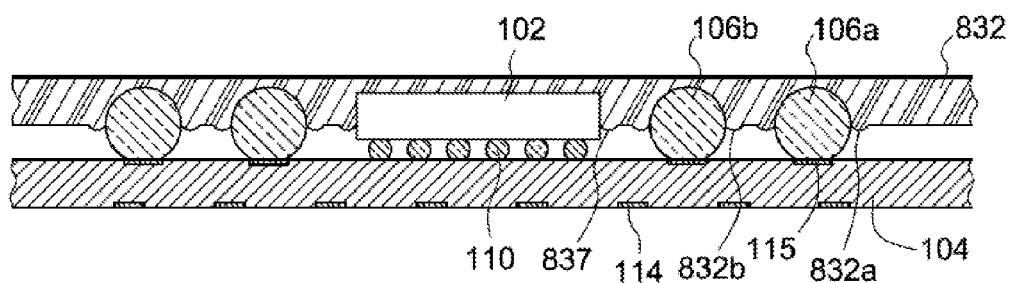

Referring to FIG. 8C, the deformable layer 832 is pressed against the connecting elements 106a, 106b and the semiconductor element 102 so that the deformable layer 832 undergoes deformation and comprises at least one first protruding portion (for example, a plurality of protruding portions 832a, 832b having a convex shape and surrounding the connecting elements 106a, 106b), and a second protruding portion 837 having a convex shape and surrounding the semiconductor element 102.

Figure 8D:
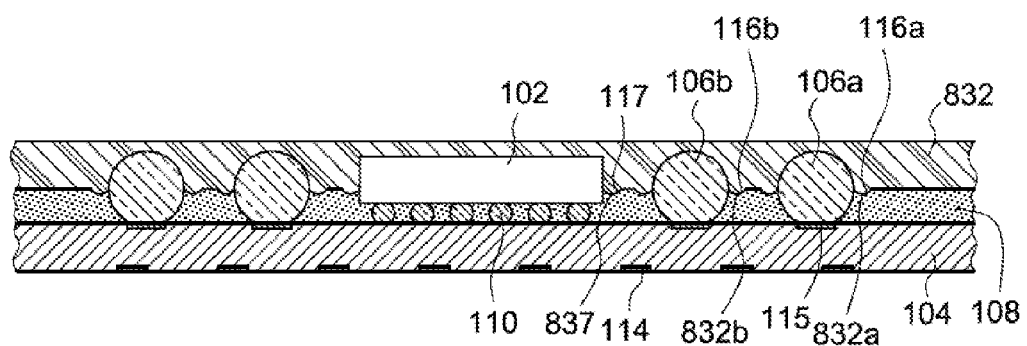

Referring to FIG. 8D, an encapsulant material (e.g., a molding compound) is filled into a space between the deformable layer 832 and the substrate 104 to form an encapsulant 108 therein. The encapsulant 108 covers at least a portion of the semiconductor element 102 and at least a portion of the connecting elements 106a, 106b. The encapsulant 108 defines a plurality of first grooves 116a, 116b conforming to the first protruding portions 836a, 836b, and a second groove 117 conforming to the second protruding portion 837, respectively.

After the encapsulant material is applied, a singulation process is performed. Then, a plurality of solder balls 112 are attached to the bottom surface 104b of the substrate 104 so as to obtain the semiconductor package 100 as illustrated in FIG. 1.

FIG. 9A, FIG. 9B, FIG. 9C, and FIG. 9D illustrate a method for manufacturing a semiconductor package according to another embodiment of the present disclosure. For example, this method can be used to manufacture the semiconductor package 400 described in connection with FIG. 4.

Figure 9A:
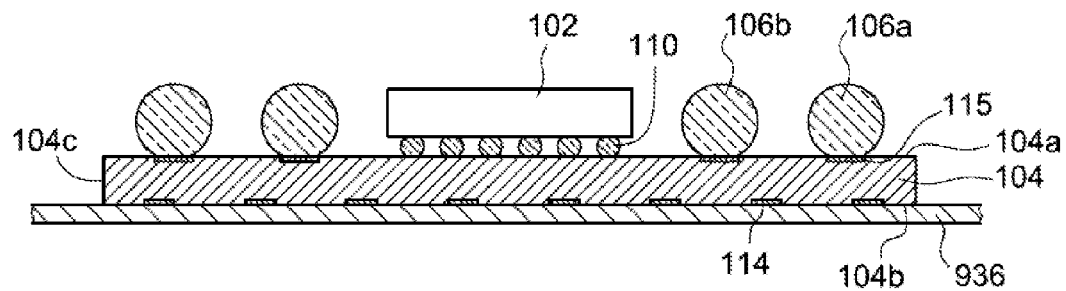
FIG. 9A, FIG. 9B, FIG. 9C, and FIG. 9D illustrate a method for manufacturing a semiconductor package according to another embodiment of the present disclosure.

Referring to FIG. 9A, a semiconductor structure, such as a semi-product, is provided on an adhesive tape 936. The structure comprises a substrate 104, a semiconductor element 102 and at least one connecting element (for example, a plurality of connecting elements 106a, 106b). The substrate 104 is a reconstitution substrate and comprises top pads 115 on a top surface 104a and bottom pads 114 on a bottom surface 104b. The semiconductor element 102 is mounted to the top substrate 104 through a plurality of interconnectors 110, such as a plurality of copper pillars or solder/stud bumps, positioned on respective bottom pads of the semiconductor element 102 and on respective top pads of the substrate 104. The connecting elements 106a, 106b are disposed on the top pads 115 of the substrate 104 and adjacent to the semiconductor element 102.

Figure 9B:
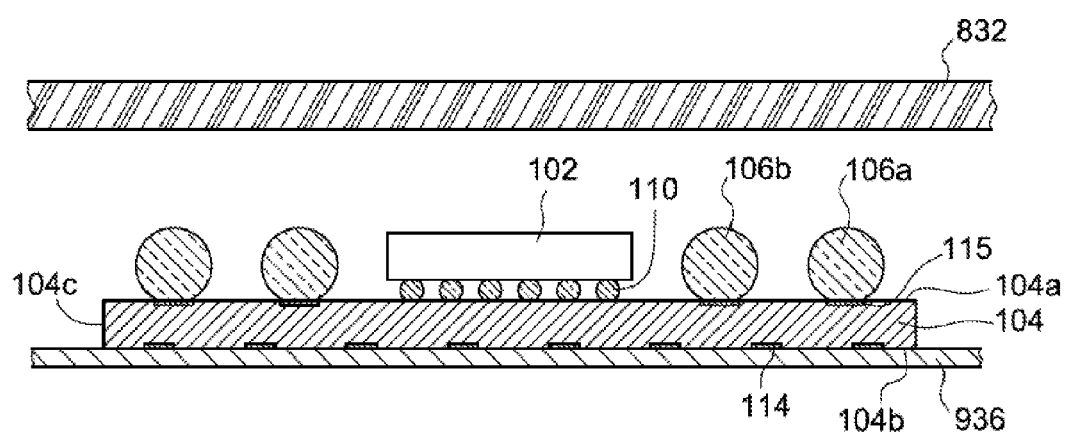

Referring to FIG. 9B, a deformable or soft layer 832 is provided. In this embodiment, the deformable layer 832 is made of a rubber or another suitable elastomer or elastomeric material, and a bottom surface of the deformable layer 832 is flat or substantially flat. However, in another embodiment, the bottom surface of the deformable layer 832 may have a pattern.

Figure 9C:
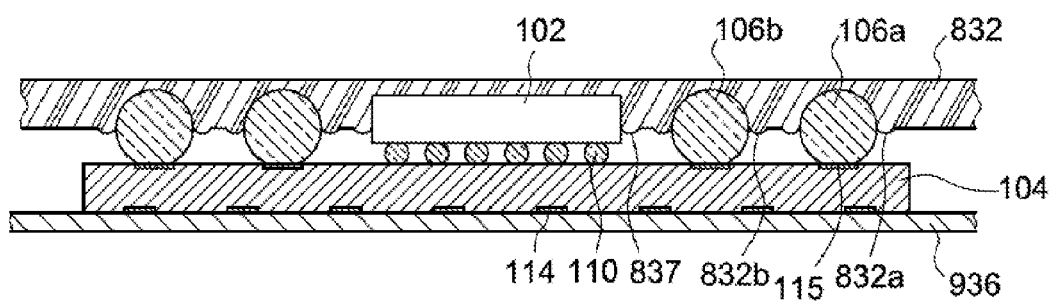

Referring to FIG. 9C, the deformable layer 832 is pressed against the connecting elements 106a, 106b and the semiconductor element 102 so that the deformable layer 832 undergoes deformation and comprises at least one first protruding portion (for example, a plurality of protruding portions 832a, 832b having a convex shape and surrounding the connecting elements 106a, 106b), and a second protruding portion 837 having a convex shape and surrounding the semiconductor element 102.

Figure 9D:
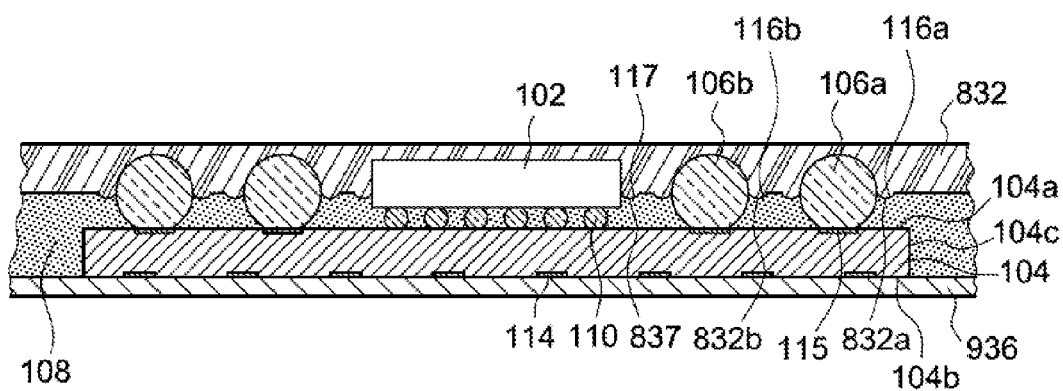

Referring to FIG. 9D, an encapsulant material (e.g., a molding compound) is filled into a space between the deformable layer 832 and the substrate 104 to form an encapsulant 108 therein. The encapsulant 108 covers at least a portion of the semiconductor element 102, at least a portion of the connecting elements 106a, 106b, and a side surface 104c of the substrate 104. The encapsulant 108 defines a plurality of first grooves 116a, 116b conforming to the first protruding portions 836a, 836b, and a second groove 117 conforming to the second protruding portion 837, respectively.

After the encapsulant material is applied, a singulation process is performed. Then, a plurality of solder balls 112 are attached to the bottom surface 104b of the substrate 104 so as to obtain the semiconductor package 400 as illustrated in FIG. 4.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
a substrate;
a semiconductor element mounted on the substrate;
at least one connecting element disposed on the substrate and adjacent to the semiconductor element; and
an encapsulant covering at least a portion of the semiconductor element and at least a portion of the connecting element,
wherein the encapsulant has a top surface, the encapsulant defines a first groove surrounding the connecting element and a second groove surrounding the semiconductor element, the connecting element is exposed from and extends upwardly from the top surface of the encapsulant, the encapsulant further defines at least one accommodating cavity for accommodating a portion of the connecting element, and a sidewall of the first groove and a sidewall of the accommodating cavity intersect to form a peak portion, wherein the peak portion surrounds and contacts the connecting element.

2. The semiconductor package of claim 1, wherein the top surface of the encapsulant and a top end of the connecting element are spaced by a distance that is greater than a depth of the first groove.

3. The semiconductor package of claim 1, wherein the semiconductor package comprises a plurality of connecting elements, the encapsulant defines a plurality of first grooves, each of the first grooves surrounds a respective one of the connecting elements, and the encapsulant comprises a protrusion between two adjacent ones of the first grooves.

4. The semiconductor package of claim 1, wherein a depth of the first groove is less than a depth of the accommodating cavity.

5. A semiconductor package, comprising:
a bottom substrate;
a top substrate;
a bottom semiconductor element mounted on the bottom substrate;

at least one interconnecting element connecting the bottom substrate and the top substrate and disposed laterally adjacent to the bottom semiconductor element; and a bottom encapsulant covering at least a portion of the bottom semiconductor element and at least a portion of the interconnecting element, the bottom encapsulant directly contacting the bottom semiconductor element and defining a plurality of grooves between the interconnecting element and the bottom semiconductor element;

wherein the bottom encapsulant comprises a peak portion surrounding and contacting the interconnecting element, the grooves include a first groove surrounding the interconnecting element, the bottom encapsulant further defines at least one accommodating cavity for accommodating at least a portion of the interconnecting element, and the peak portion is defined by the first groove and the accommodating cavity.

6. The semiconductor package of claim 5, further comprising a top semiconductor element and a top encapsulant, wherein the top semiconductor element is mounted to the top substrate, and the top encapsulant covers at least a portion of the top semiconductor element.

7. The semiconductor package of claim 5, wherein a portion of the interconnecting element is disposed in the first groove.

8. The semiconductor package of claim 7, wherein a width of the interconnecting element measured from one side of the interconnecting element in the first groove to an opposite side of the interconnecting element in the first groove is greater than or equal to a width of an upper portion of the interconnecting element.

9. The semiconductor package of claim 7, wherein a cross section of the first groove adjacent the interconnecting element is concave, and the first groove surrounds the peak portion.

10. The semiconductor package of claim 7, wherein the grooves include a second groove surrounding the bottom semiconductor element, and the bottom semiconductor element is exposed from the bottom encapsulant.

11. The semiconductor package of claim 5, wherein the bottom encapsulant further covers a side surface of the bottom substrate.

12. The semiconductor package of claim 5, wherein a depth of the first groove is less than a depth of the accommodating cavity.

13. A semiconductor package, comprising:
a bottom substrate;
a top substrate;
a semiconductor element mounted on the bottom substrate;
at least one interconnecting element connecting the bottom substrate and the top substrate and disposed laterally adjacent to the semiconductor element; and
an encapsulant covering a portion of the semiconductor element and a portion of the interconnecting element, the encapsulant directly contacting the semiconductor element,
wherein the encapsulant comprises a peak portion surrounding the interconnecting element, the encapsulant defines a first groove surrounding the interconnecting element and surrounding the peak portion, the encapsulant defines a second groove between the first groove and the semiconductor element, the encapsulant further defines at least one accommodating cavity for accommodating at least a portion of the interconnecting element, a sidewall of the first groove and a sidewall of the accommodating cavity intersect to form the peak portion, and the peak portion surrounds and contacts the interconnecting element.

14. The semiconductor package of claim 13, wherein the semiconductor package comprises a plurality of interconnecting elements, the encapsulant defines a plurality of first grooves including the first groove, each of the first grooves surrounds a respective one of the interconnecting elements, and the encapsulant comprises a protrusion between two adjacent ones of the first grooves.

15. The semiconductor package of claim 13, wherein the semiconductor element is a bottom semiconductor element and the encapsulant is a bottom encapsulant, further comprising a top semiconductor element and a top encapsulant, wherein the top semiconductor element is mounted to the top substrate, and the top encapsulant covers at least a portion of the top semiconductor element.

16. The semiconductor package of claim 1, wherein the first groove comprises a concave cross section adjacent a sidewall of the connecting element.

17. The semiconductor package of claim 1, wherein the first groove further comprises a lowermost portion spaced apart from a sidewall of the connecting element.

18. The semiconductor package of claim 1, wherein the connecting element comprises a portion disposed in the first groove.

19. The semiconductor package of claim 4, wherein the depth of the first groove is no greater than or less than one half of the depth of the accommodating cavity.

* * * * *